United States Patent [19]
Mori et al.

[11] Patent Number: 6,018,395
[45] Date of Patent: Jan. 25, 2000

[54] ALIGNMENT SYSTEM

[75] Inventors: Makiko Mori, Atsugi; Shunichi Uzawa, Nakamachi; Kunitaka Ozawa, Isehara; Hirohisa Ohta, Kawasaki; Noriyuki Nose, Machida, all of Japan

[73] Assignee: Canon Kabushiki Kaisha, Tokyo, Japan

[21] Appl. No.: 08/766,928

[22] Filed: Dec. 16, 1996

Related U.S. Application Data

[63] Continuation of application No. 08/431,320, Apr. 28, 1995, abandoned, which is a continuation of application No. 08/092,590, Jul. 15, 1993, abandoned, which is a continuation of application No. 07/957,072, Oct. 6, 1992, abandoned, which is a continuation of application No. 07/587,989, Sep. 25, 1990, abandoned.

[30] Foreign Application Priority Data

Sep. 26, 1989 [JP] Japan .................................... 1-248139
Sep. 26, 1989 [JP] Japan .................................... 1-248140

[51] Int. Cl.$^7$ .................................................. G01B 11/00
[52] U.S. Cl. ...................... 356/401; 250/548; 250/559.3; 355/53
[58] Field of Search ...................... 356/399–401; 250/548, 559.3; 355/43, 53; 29/271

[56] References Cited

U.S. PATENT DOCUMENTS

| | | |
|---|---|---|
| 4,538,914 | 9/1985 | Yomoda et al. ........................ 356/401 |
| 4,564,284 | 1/1986 | Tsutsui .................................. 355/53 X |
| 4,676,630 | 6/1987 | Matsushita et al. ...................... 355/53 |
| 4,704,033 | 11/1987 | Fay et al. ............................. 356/401 X |
| 4,719,357 | 1/1988 | Ayata et al. ............................. 250/548 |
| 4,748,477 | 5/1988 | Isohata et al. ............................ 355/53 |
| 4,749,867 | 6/1988 | Matsushita et al. ................. 250/442.1 |
| 4,830,500 | 5/1989 | Kuroki et al. .......................... 356/401 |
| 4,912,408 | 3/1990 | Sawada et al. ..................... 324/207.13 |
| 4,918,320 | 4/1990 | Hamasaki et al. ...................... 356/401 |
| 4,958,160 | 9/1990 | Ito et al. ................................ 356/401 |
| 5,182,615 | 1/1993 | Kurosawa et al. ..................... 356/400 |

FOREIGN PATENT DOCUMENTS

| | | |
|---|---|---|
| 3428225 | 2/1985 | Germany . |
| 60-77422 | 5/1985 | Japan . |

*Primary Examiner*—K Hantis
*Attorney, Agent, or Firm*—Fitzpatrick, Cella, Harper & Scinto

[57] ABSTRACT

An alignment method useable with an original having a pattern and a substrate having a surface area on which the pattern of the original is printed. The alignment method comprises detecting plural marks, calculating plural times, the amount of rotational deviation on the basis of different combinations of marks, calculating the quantity of rotational correction of the original and the substrate by using the computed rotational deviations, and aligning on the basis of the calculated quantity of the rotational deviation.

9 Claims, 11 Drawing Sheets

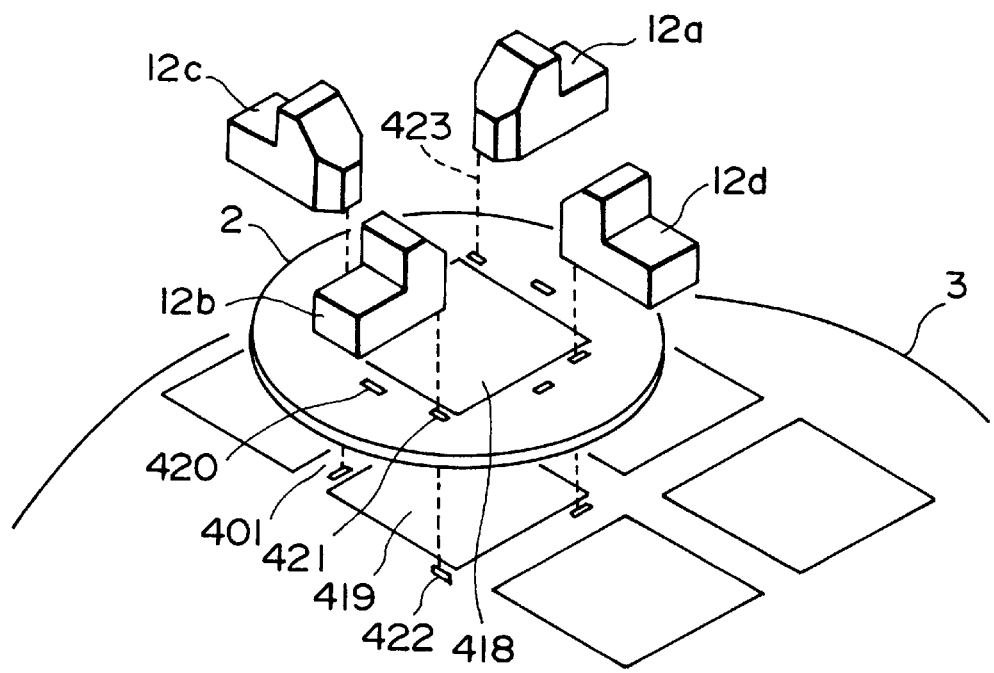
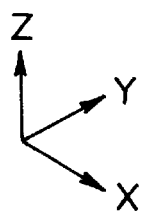
F I G. 4

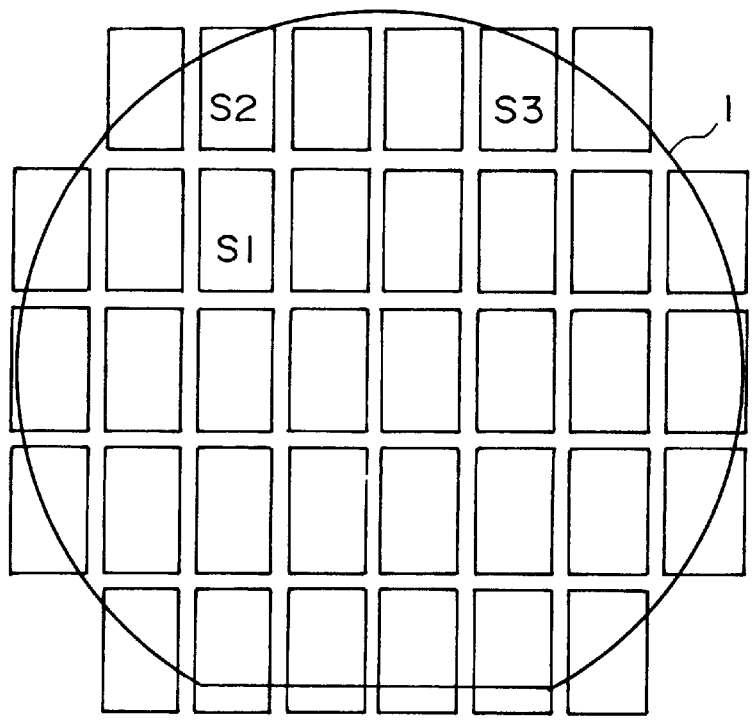
F I G. 7
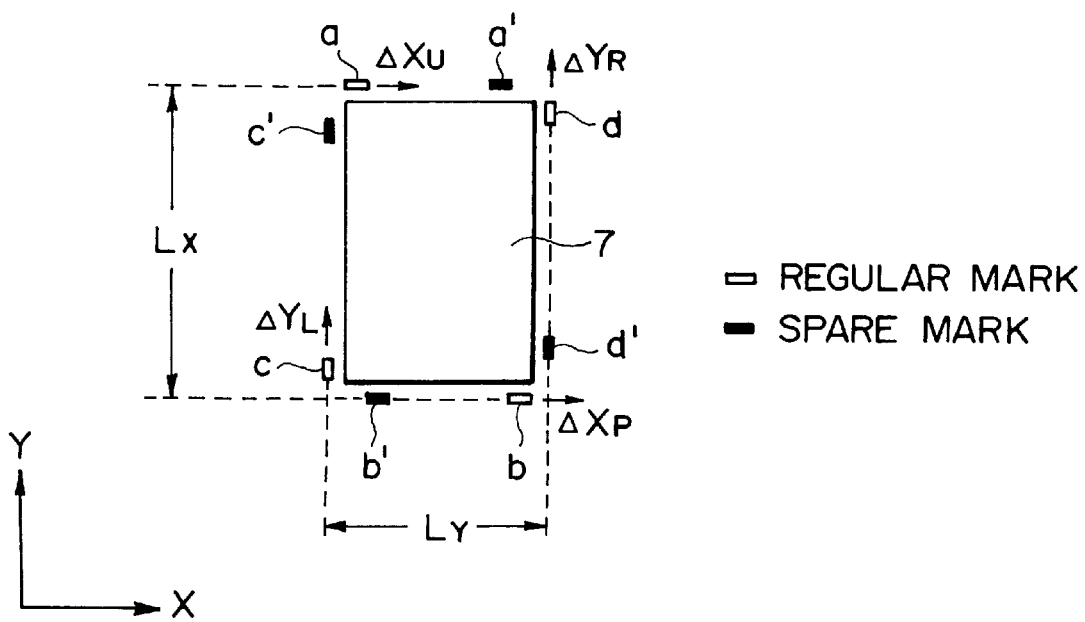
F I G. 8

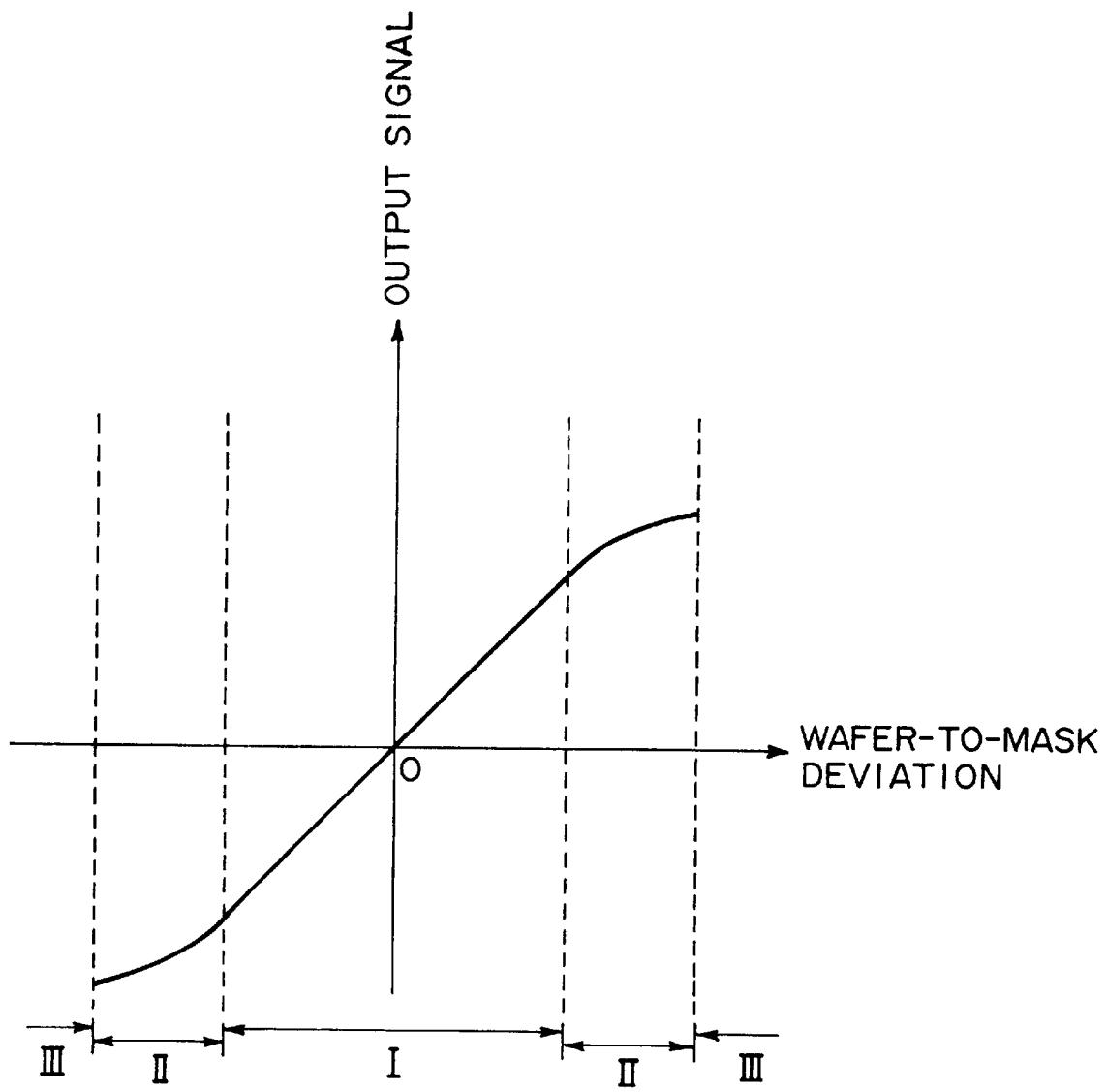
F I G. 9

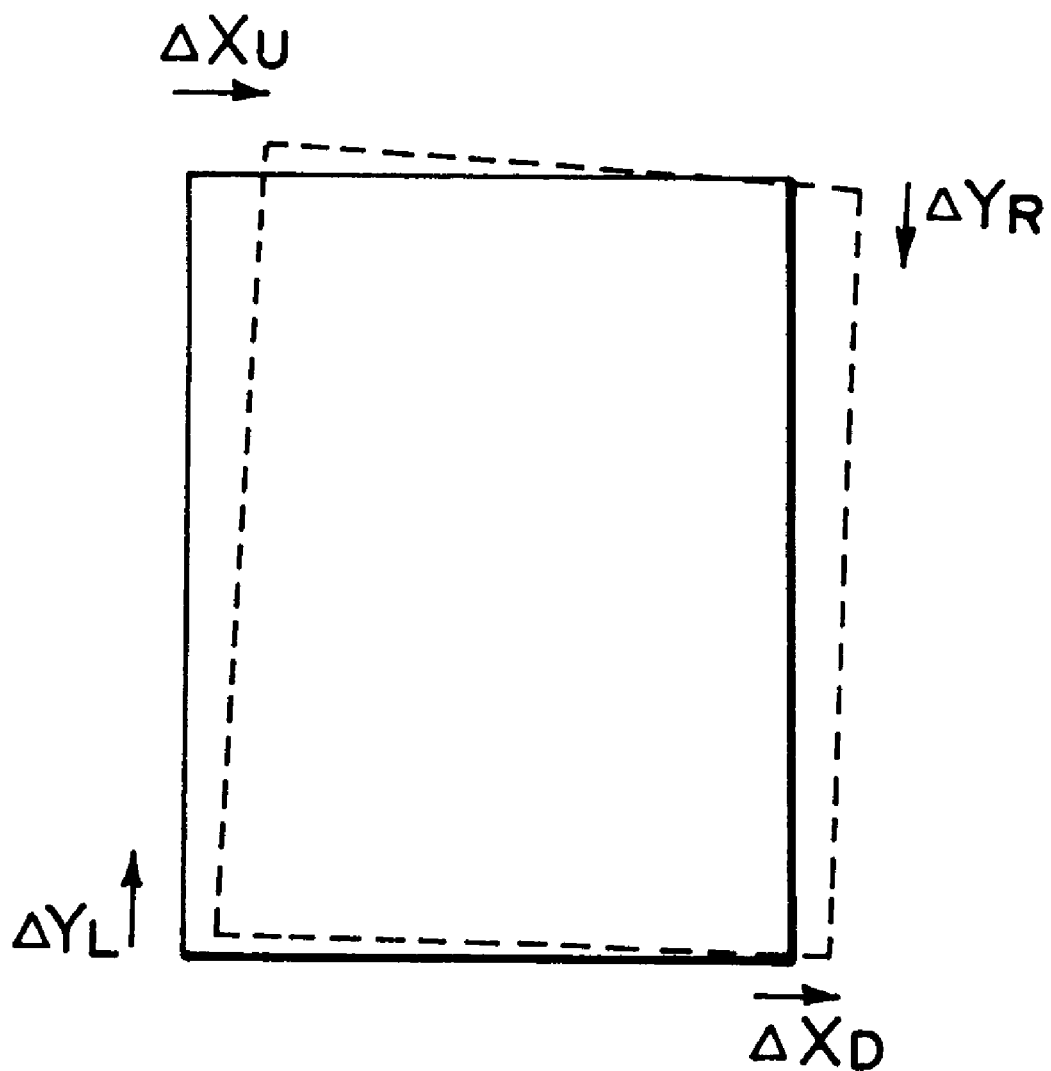
F I G. 13

ALIGNMENT SYSTEM

This application is a continuation of application Ser. No. 08/431,320 filed Apr. 28, 1995, which in turn is a continuation of application Ser. No. 08/092,590, filed Jul. 15, 1993, which in turn is a continuation of application Ser. No. 07/957,072, filed Oct. 6, 1992, which in turn is a continuation of application Ser. No. 07/587,989, filed Sep. 25, 1990, now all abandoned.

FIELD OF THE INVENTION AND RELATED ART

This invention relates to an alignment system and, more particularly, to an alignment system for use in a step-and-repeat type exposure apparatus, for detecting the relative position of an original such as a mask and a substrate such as a semiconductor wafer.

In exposure apparatuses for the manufacture of semiconductor integrated circuits, it is necessary to attain, before the exposure operation, high-precision registration between a mask having an integrated circuit pattern formed thereon and a semiconductor wafer to which the circuit pattern is to be transferred. By way of example, in the case of an integrated circuit for a 100 megabit DRAM, the linewidth of the pattern is of the order of 0.25 micron order and, thus, a registration precision higher than 0.06 micron is required.

Alignment and exposure menthods in conventional step-and-repeat type exposure apparatuses, include the global alignment method, the die-by-die alignment method, and the zone alignment method. In the global alignment method, the alignment operation is effected only with respect to some of all the shot areas of one wafer by using alignment marks and, after this, exposures are effected while moving a wafer stage stepwise through a distance corresponding to the grid interval (the distance between the centers of adjacent shot areas). In the die-by-die alignment method, for each shot area, the alignment operation using alignment marks and the exposure operation are effected. In the zone alignment method, a single alignment operation is effected in relation to plural shot areas.

SUMMARY OF THE INVENTION

In the die-by-die alignment method, in regard to such a shot area with respect to which no positional information is obtainable from the alignment marks of a mask and a wafer due to a fault of the wafer alignment mark, for example, the exposure of that shot area is given up or the exposure is effected after the wafer is moved from the preceding shot area position by a distance corresponding to the grid interval or, alternatively, the wafer is moved from the preceding shot area position to the grid point (the design center of the shot area) of the current shot area and thereafter a corrective drive is effected on the basis of the alignment correction quantity related to an adjacent alignment completed shot area. In any case, since the alignment operation using alignment marks is not effected with respect to the current shot area, the precision is insufficient for attaining a linewidth of the order; and of 0.25 micron.

It is, accordingly, an object of the present invention to provide an alignment system by which, even with regard to such a shot area with respect to which positional information is not obtainable from all the alignment marks, high-precision alignment between an original and a substrate to be exposed can be attained by using obtained positional information.

In accordance with an aspect of the present invention, to achieve the above object, in an alignment system of die-by-die alignment type, a plurality of correction (quantitative calculation) processing sequences are provided and, in accordance with the number of the pieces of the mark measured information obtained at that shot area, one correction processing sequence is selected automatically.

In this specification, the term "alignment operation" means adjustment of the positional relationship between an original and a substrate to be exposed, by using marks provided on the original and/or the substrate. The direction of adjustment does not matter. Hereinafter, the position adjustment in a plane (X-Y plane) parallel to the surface of the substrate or the original will be referred to as "AA (autoalignment)" and the position adjustment in a direction (Z-axis direction) perpendicular to the X-Y plane (e.g. the proximity gap setting of the substrate and the original, or the focus adjustment) will be referred to as "AF (autofocusing)".

In a preferred embodiment of the present invention, in the die-by-die autofocusing (AF) or in the die-by-die autoalignment (AA), at least in accordance with the layout information and the occurrence of a measurement error (in the case of autoalignment, it includes an AF measurement error with regard to the same mark or adjacent marks), a correction processing sequence is selected.

In another preferred form of the present invention, each shot area is equipped with spare marks and, if the number of the pieces of measured information is insufficient for calculation of the quantity of correction, mark measuring means is moved to observe the spare mark, whereby information sufficient for calculation of the quantity of correction of that shot area can be detected.

In the present invention, if the number of the pieces of information obtained by the mark measuring means is redundant with respect to the calculation of the quantity of correction, such redundancy is effectively used to execute highly reliable calculation. Also, if the number of the pieces of obtained information is sufficient as required for calculation of the quantity of correction, calculation of the quantity of correction is executed on the basis of the obtained information. If the number of the pieces of obtained information is insufficient for calculation of the quantity of correction, substitute information is used to complement the insufficient information and the calculation of the quantity of correction is effected. Such substitute information may be used to provide the aforementioned redundancy.

As an example, where four-eye mark measuring means is used to measure four pairs of marks of a wafer and a mask so as to obtain one piece of measured information with regard to each mark pair, four-eye alignment operation is effected by using four pieces of measured information. If, in this case, only three pieces of measured information are obtained, the alignment operation is automatically transferred to the three-eye alignment operation using the three pieces of measured information. Also, if only two pieces of measured information is obtained, one or two spare marks are automatically measured to attain the three-eye or four-eye alignment operation.

In this manner, in the present invention, even with regard to such a shot area with respect to which all the marks are not measured or a measurement error is produced, correct calculation of the quantity of correction using the remaining measured information of that shot area is attained. Thus, with regard to such a shot area, high-precision alignment is attainable.

According to this aspect of the present invention, as described, even with regard to such a shot area in which all the marks at a peripheral portion of the substrate, to be exposed, are not complete or present, or with regard to such a shot area in which a mark is broken due to a process error, correct alignment is attainable and the yield can be increased.

Conventionally, in an alignment system, rectilinear deviation between an alignment mark formed on a mask and an alignment mark formed on a semiconductor wafer, in a direction parallel to the X-Y coordinate axis, is measured and, on the basis of plural rectilinear deviation data $\Delta Xm$ and $\Delta Yn$ obtainable from plural pairs of marks of the mask and the wafer, rectilinear deviation ($\Delta X$, $\Delta Y$) and rotational deviation ($\Delta \theta$) of the whole shot area between the mask and the wafer is calculated. Based on the result of calculation, relative and corrective drive of the mask and the wafer is effected to align them.

In such an alignment system, for enhanced precision of measurement of the mark deviation, it is necessary to increase the magnification of a measurement optical system. However, the measurement precision is inversely proportional to the size of the measurement range (the field of the measuring optical system). For this reason, an attempt to improve the registration precision results in an increase in the probability that the mark is outside the measurement range. This leads to a disadvantage of increasing the number of times a mark searching operation or a mark chasing operation must be performed, resulting in a decreased throughput of the exposure apparatus.

Further, in a conventional alignment system, the rotational deviation ($\Delta \theta$) is calculated by using rectilinear deviation data with respect to either the X direction or the Y direction, in accordance with equations which are preset in the apparatus. Alternatively, the rotational deviation $\Delta \theta$ is calculated by simply averaging two rotational deviations as calculated from rectilinear deviations with respect to the X and Y directions, respectively. As a consequence, distortion easily occurs in a shot area of the wafer, in a particular direction. Also, the two rotational deviations in the two directions have different reliabilities due to the factor of length or the like. Thus, the precision of the obtained rotational deviation ($\Delta \theta$) is not always sufficient, resulting in increasing the numbers of times a mark chasing operation must be performed. Thus, there is the disadvantage of decreased throughput of the exposure apparatus.

It is accordingly a second object of the present invention to provide an alignment system by which the throughput of the exposure apparatus can be improved.

In accordance with an aspect of the present invention, to achieve the above object, the number of marks for calculation of the relative deviation of a mask and a wafer, has a redundancy in relation to calculation of rotational deviation between the mask and the wafer, and separate quantities of rotational deviation are determined by calculation based on different combinations of these marks. By weighting the thus determined rotational deviation quantities, the amount of rotational deviation is determined. In one preferred embodiment of the present invention, in a die-by-die type exposure apparatus (stepper) in which the alignment operation is effected with respect to each shot area on a wafer, even such a zone in which the signal output from each mark pair is in a non-linear relation with the relative deviation of the mask and the wafer, is used and, in accordance with the desired precision of the measured data, one of the rotational deviation quantities is selected or, alternatively, if the precision is of the same level, these quantities are averaged, to determine the amount of rotational deviation (the amount of corrective drive).

In another preferred form of this invention, in a die-by-die type stepper, each rotational deviation quantity is weighted in accordance with the reliability of the length or shape of the shot area, to determine the amount of corrective drive.

In this aspect of the present invention, a plurality of rotational deviation quantities can be calculated on the basis of different combinations of measured information as obtainable from the mark measuring means. Accordingly, by weighting computation of these rotational deviation quantities in accordance with the precision of the measured information, or by selection of them, the amount of corrective drive for registration of the original and the substrate can be obtained with high precision.

Also, since the rotational deviation quantity is selected in accordance with the precision of the measured information, even if any mark comes into the non-linear zone, a correct rotational deviation quantity can be detected at a sufficiently high precision on the basis of the measured information within the linear zone.

Thus, according to this aspect of the invention, for high-precision alignment of an original and a substrate, the number of mark chasing operations can be reduced without narrowing the measurement range and, therefore, the throughput can be increased.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view, for explaining the step-and-repeat exposure method.

FIG. 7 is a schematic view, exemplifying the shot layout of one wafer.

FIG. 8 is a schematic view, illustrating the disposition of alignment marks of one shot area.

FIG. 9 is a graph showing the characteristics of an output signal from a pickup in relation to the wafer-to-mask deviation in the X and Y directions.

FIG. 13 is a schematic view, for explaining the state wherein one alignment mark of a wafer is out of a high-precision measurement zone.

DESCRIPTION OF THE PREFERRED EMBODIMENTS

Figure 1:
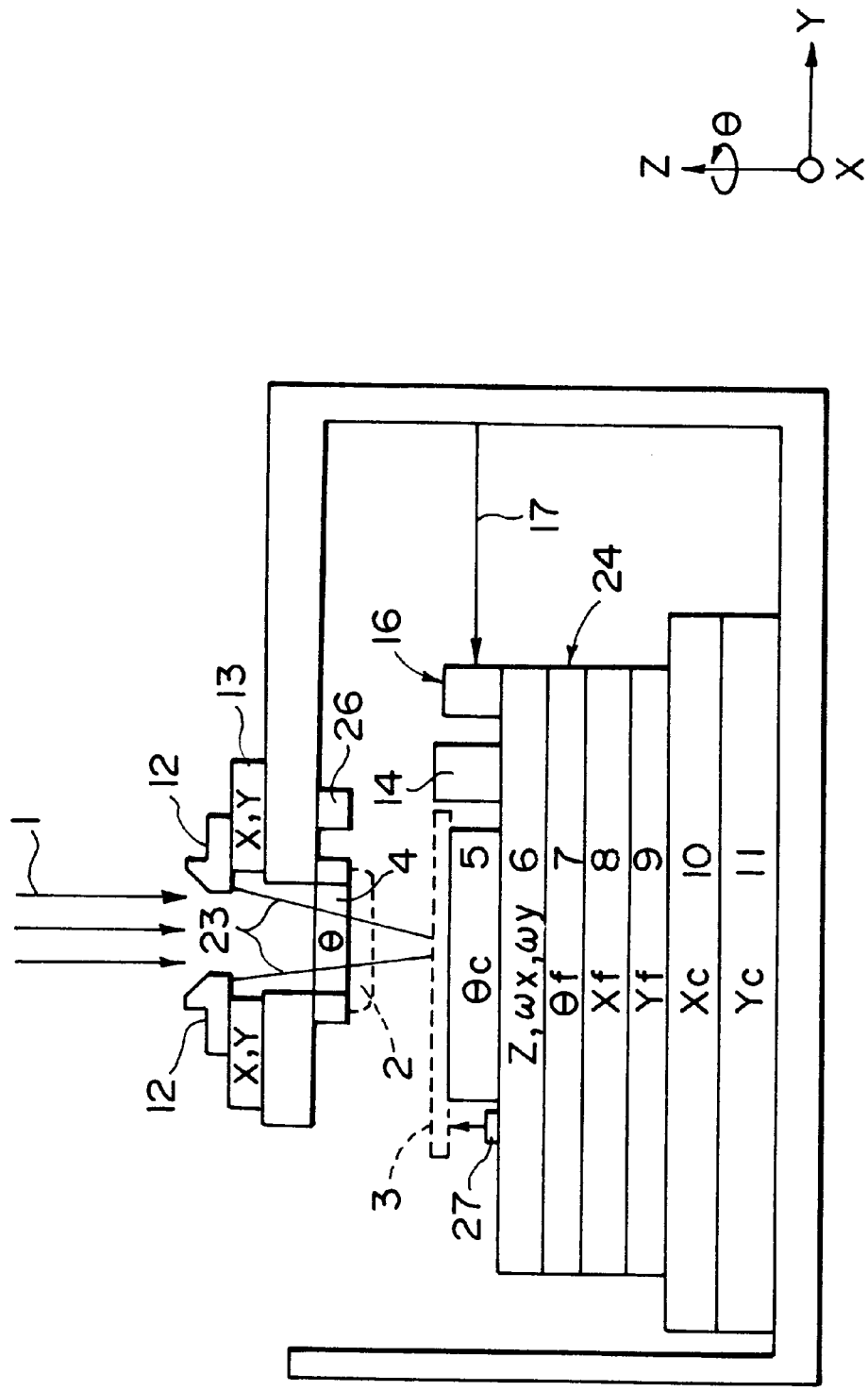
FIG. 1 is a schematic view showing a major part of a step-and-repeat type exposure apparatus according to an embodiment of the present invention.

FIG. 1 illustrates the structure of a part of a step-and-repeat type exposure apparatus (stepper) which pertains to the mask-to-wafer alignment and which is around an exposure stage. In FIG. 1, denoted at 1 is light for exposure (photoprinting) which is projected substantially along the Z-axis direction and which comprises X-rays contained in a synchrotron orbit radiation (SOR), for example. Denoted at 2 is a mask having formed thereon a pattern which is to be transferred onto a semiconductor wafer 3. Denoted at 4 is a mask θ stage for rotationally moving the mask 2 along a plane (X-Y plane) parallel to the surface thereof; and at 5 is denoted a θ rough-motion stage for rotationally moving the wafer 3 along a plane (X-Y plane) parallel to the surface thereof. Denoted at 6 is a Z tilt stage which is effective to move the wafer 3 in the Z direction (movement toward the exposure light 1), in the wx direction (rotation about the X axis) and in the wy (rotation about the Y axis), respectively, when the wafer 3 is to be opposed to the mask 2 with a predetermined proximity gap in the Z-axis direction. Denoted at 7 is a θ fine-motion stage for minutely rotating the wafer 3 in the X-Y plane; denoted at 8 is an X fine-motion stage for minutely moving the wafer in the X direction; denoted at 9 is a Y fine-motion stage for minutely moving the wafer in the Y direction; denoted at 10 is an X rough-motion stage; and denoted at 11 is a Y rough-motion stage. The θ rough-motion stage 5, the Z tilt stage 6, the θ fine-motion stage 7, the X fine-motion stage 8, the Y fine-motion stage 9, the X rough-motion stage 10 and the Y rough-motion stage 11, cooperate with each other to provide a wafer stage 24.

Figure 2:
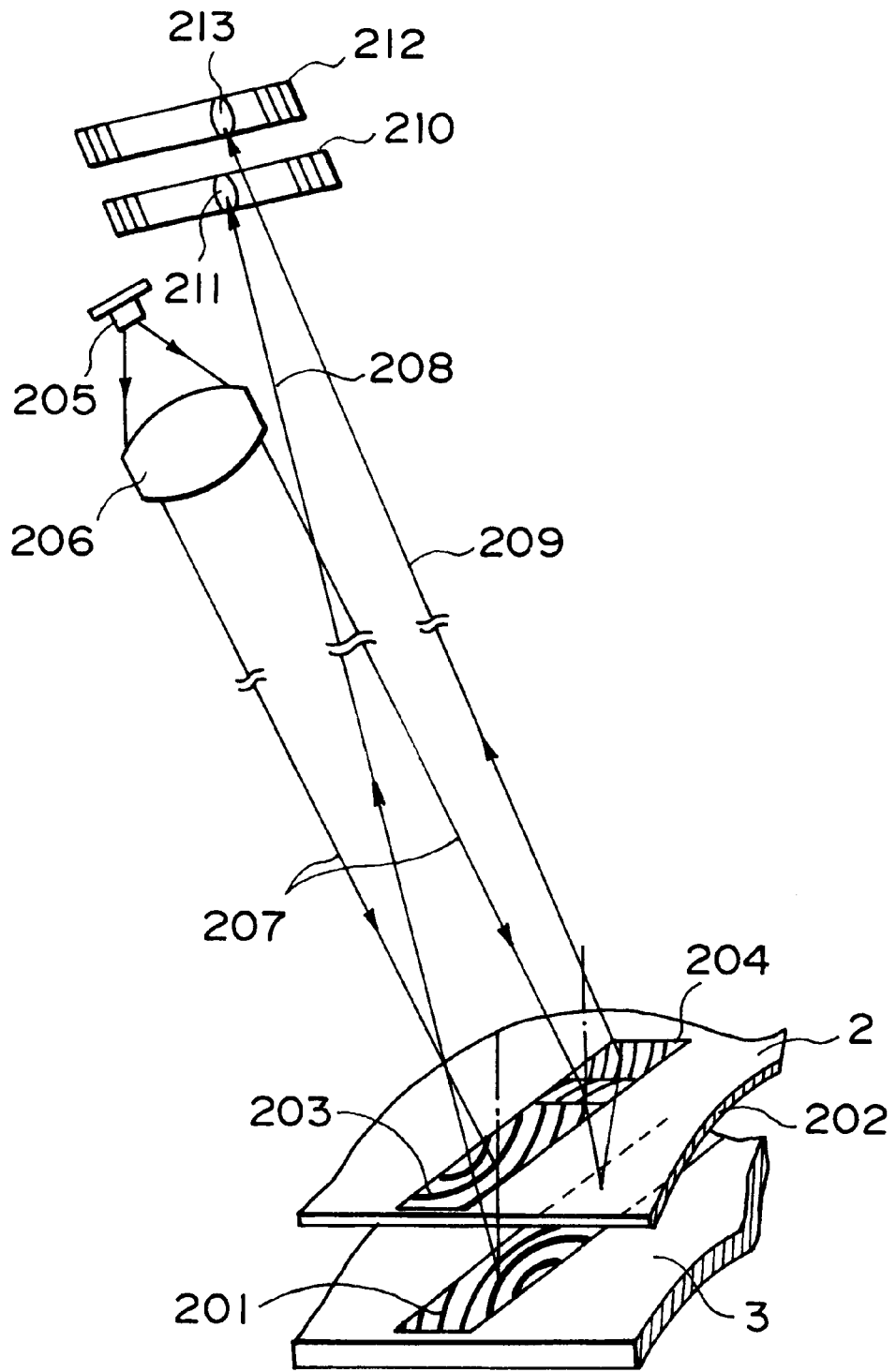
FIG. 2 is a schematic view, for explaining the principle of fine autoalignment/autofocusing based on detection of deviation with respect to a direction parallel to the surface of a wafer or a mask and a direction perpendicular thereto.

Denoted at 12 are pickups which are adapted to project light to alignment marks formed on the mask 2 and the wafer 3 and which are adapted to detect scattered light from these marks. In this embodiment, each shot area on the wafer 3 is equipped with eight alignment marks, comprising regular marks and spare marks, formed on the scribe line around the shot area, wherein each regular mark and an associated spare mark are formed adjacent corresponding one of the four sides of that shot area. Each alignment mark is adapted to detect an error in the mask-to-wafer registration with respect to a direction which is parallel to the side at which that alignment mark is formed. For this purpose, as shown in FIG. 2, a diffraction grating that provides an autoalignment (AA) mark 201 as well as an autofocusing (AF) mark 202, for detection of the spacing between the mask 2 and the wafer 3, has been formed on the wafer together with a semiconductor circuit pattern, in the preceding process. Also, the mask 2 is provided with eight alignment marks (203, 204) associated with the alignment marks of the wafer 3, respectively, which mask alignment marks are formed of gold, for example, together with a semiconductor circuit pattern which is to be transferred to the wafer.

In FIG. 2, denoted at 205 is a semiconductor laser (light emitting element); denoted at 206 is a collimator lens for transforming the light emitted by the semiconductor laser 205 into a parallel light; denoted at 207 is the light beam emitted by the semiconductor laser 205 and transformed by the collimator lens 206 into the parallel light; denoted at 208 is an autoalignment (AA) light beam, to be received, which bears positional deviation information (AA information) given by an optical system constituted by the AA mark 201 of the wafer and the AA mark 203 of the mask; and denoted at 209 is an autofocusing (AF) light beam, to be received, which bears gap information (AF information) given by an optical system constituted by the AF mark 202 of the wafer and the AF mark 204 of the mask. Denoted at 210 is an autoalignment (AA) sensor for converting the position of an autoalignment (AA) light spot 211, formed by the AA light beam 208, into an electric signal (AA information). For example, the sensor 210 comprises a line sensor such as a CCD array. Denoted at 212 is an autofocusing (AF) sensor for converting the position of an autofocusing (AF) light spot 213, formed by the AF light beam 209, into an electric signal (AF information). For example, the sensor 212 comprises a line sensor such as a CCD array.

Figure 3:
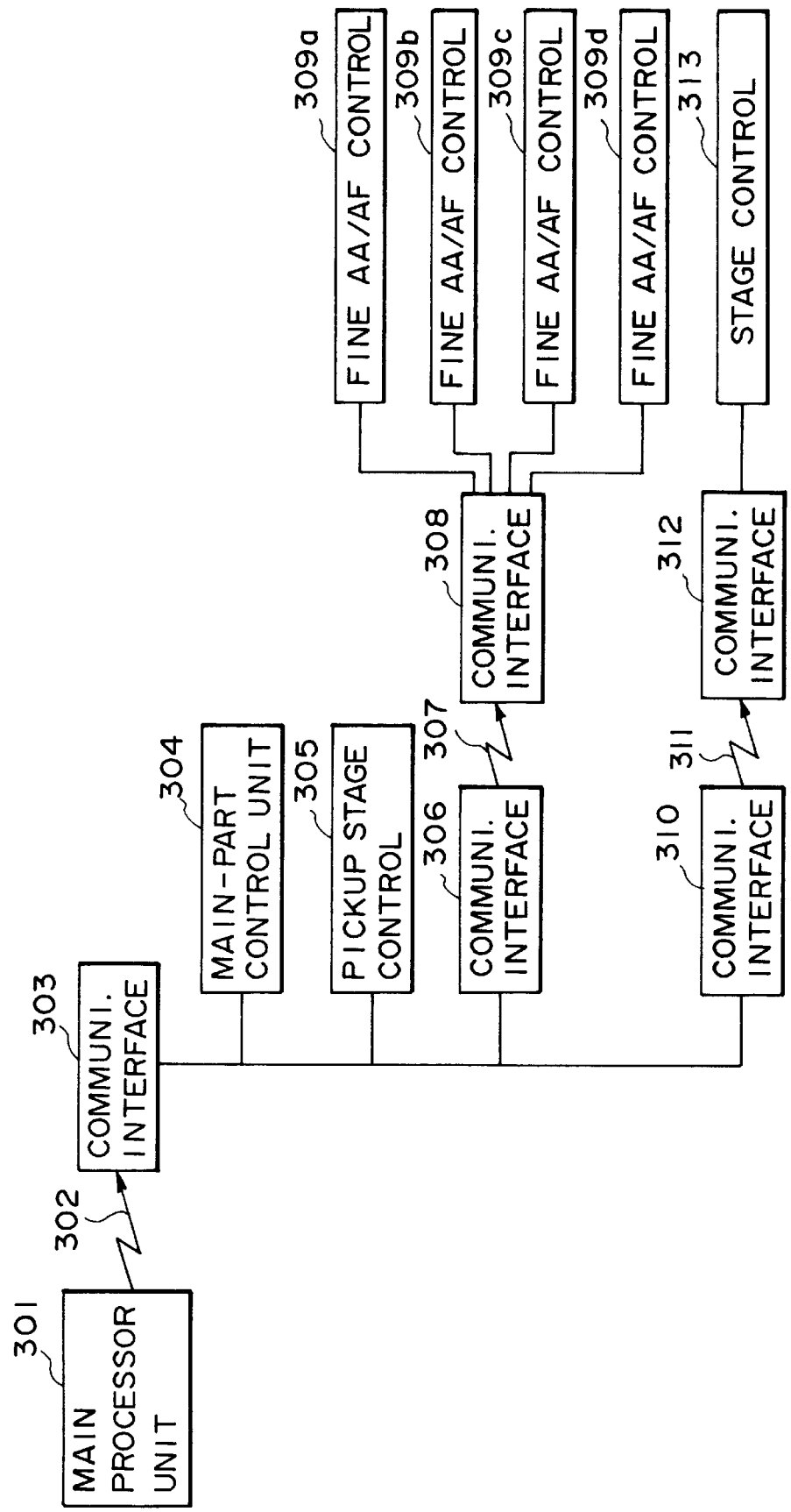
FIG. 3 is a block diagram showing the hardware of a control system of the exposure apparatus of FIG. 1.

FIG. 3 illustrates the structure of a control system of the exposure apparatus of FIG. 1. While not shown in the drawings, the exposure apparatus of FIG. 1 is equipped with a mirror unit for expanding the flux of X-rays, emitted from a SOR in the form of a horizontal sheet-like beam, in the vertical direction to provide an area beam; a main part unit which includes an alignment unit for aligning the mask and the wafer and an exposure unit for exposing the aligned mask and the wafer with the area X-ray beam; an attitude control unit for controlling the attitude of each of the mirror unit and the main-part unit; as well as a chamber and air conditioning unit for controlling the ambience around the mirror unit and the main-part unit.

In FIG. 3, denoted at 301 is a main processor unit for controlling the operation of the apparatus as a whole; denoted at 302 is a communication line for communicating the main processor unit 301 with the main-part unit; denoted at 303 is a main-part side communication interface; denoted at 304 is a main-part control unit; and denoted at 305 is a pickup stage control means. Denoted at 306 and 308 are communication interfaces and denoted at 307 is a communication line, all of which are adapted to communicate, in the main-part unit, the main-part control unit 304 with fine AA/AF control means 309a, 309b, 309c and 309d for driving the fine alignment θ, X and Y fine-motion stages and the mask θ stage. Denoted at 310 and 312 are communication interfaces and denoted at 311 is a communication line all of which are adapted to communicate, in the main-part unit, the main-part control unit 304 with a stage control means 313 which controls the wafer prealignment and the stepwise movement.

FIG. 4 illustrates the step-and-repeat exposure method. For simplicity in illustration, as compared with FIG. 1, illustration of the mask θ stage 4 which is driving means for the mask 2, the wafer stage 24 which is driving means for the wafer 3 and the pickup stage 13 which is driving means for the pickup 12, is omitted in FIG. 4.

In FIG. 4, denoted at 12 (12a–12d) are pickups for aligning the mask 2 and the wafer 3; denoted at 418 is a pattern (to be transferred) formed on the mask; at 419 is a pattern, transferred, having been formed on the wafer in the preceding process; denoted at 420 are alignment marks for mask alignment, to be used for. aligning the mask 2 with a reference mark 14 (FIG. 1) provided on the wafer stage 24; denoted at 421 are alignment marks formed on the mask, for aligning the mask pattern 418 with the transferred pattern 419; denoted at 422 are alignment marks formed on the wafer for the same purpose; denoted at 423 are projected light beams, projected from the pickups 12 for the same purpose; and denoted at 401 are scribe lines defined between shot areas. The alignment marks 421 and 422 of the mask and the wafer are formed on these scribe lines.

The mask 2 and the wafer 3 can be aligned with each other in the following manner: First, under the condition that the mask 2 and the wafer 3 are supported to be opposed to each other, the pickups 12a–12d project light beams 423 and, through the corresponding alignment marks 421 and 422 of the mask and the wafer, the gap between the mask and the wafer is measured. On the basis of the information obtained from the four pickups, the amount of gap correcting drive is calculated and the wafer stage 24 is driven to set the gap between the mask and the wafer in respect to the z-axis direction, to be equal to the gap for exposure.

Subsequently, the pickups 12a–12d project light beams 423 again, and deviation between paired alignment marks 421 and 422 of the mask and the wafer, along a plane parallel to the surface of the mask or wafer, is measured. On the basis of the information obtained from the four pickups, the amount of corrective drive of that shot area as a whole is calculated, and the mask θ stage 4 and the wafer stage 24 are driven to bring the mask pattern 418 and the wafer pattern 419 into alignment with each other. After the alignment is attained, the exposure operation is effected, whereby the mask pattern 418 is transferred onto the wafer 3. Thereafter, the wafer stage 24 is driven so that the next shot area comes to a position below the mask. In a similar manner, the alignment and exposure operation is repeated, whereby exposures of all the shot areas are effected.

Figure 5:
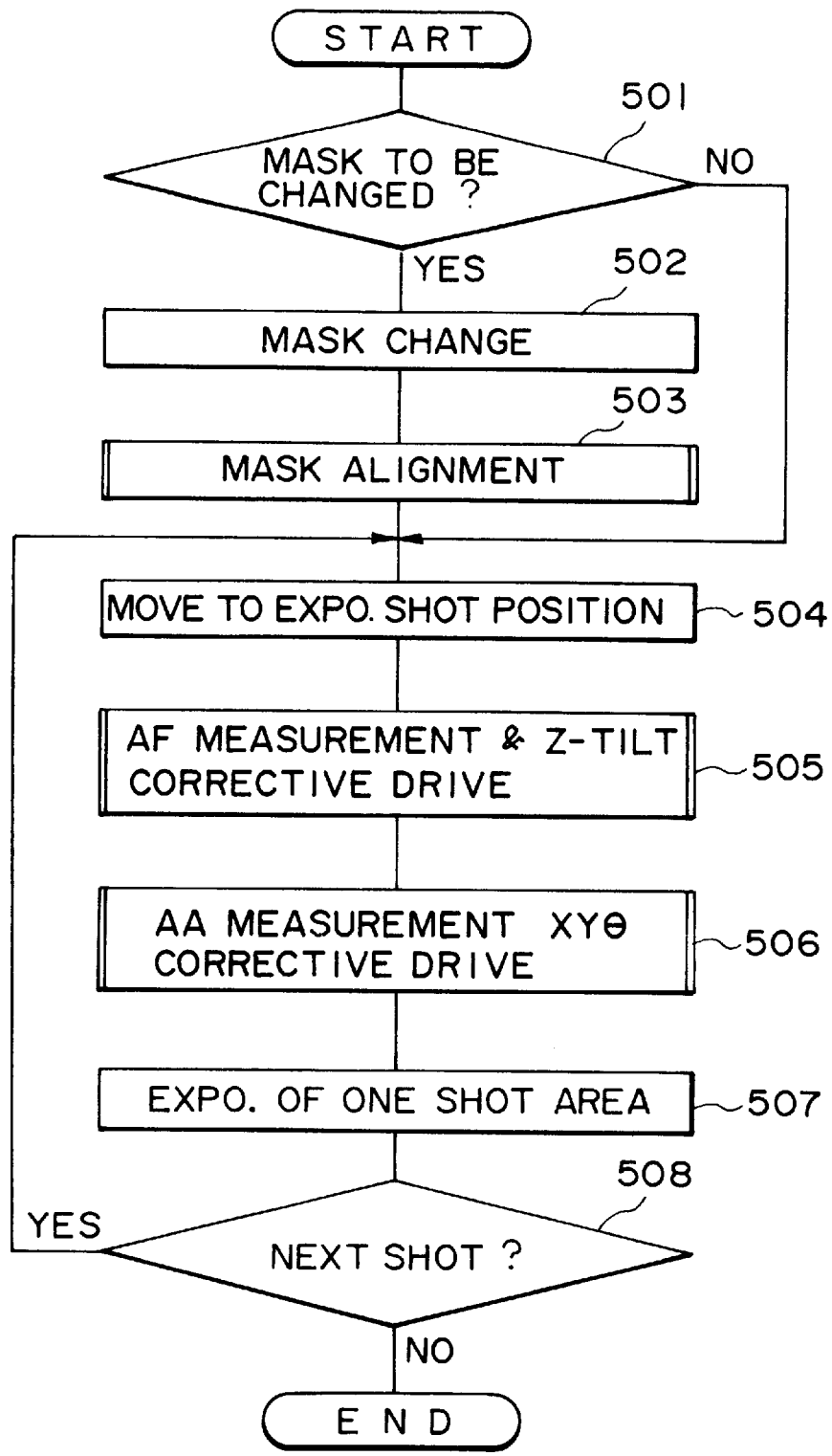
FIG. 5 is a flow chart, illustrating the flow in one patch of the step-and-repeat exposure sequence.

FIG. 5 is a flow chart, illustrating the flow of one patch of the step-and-repeat exposure sequence. The "one patch" is the unit with which the photoprinting of one wafer can be effected without replacement of a mask. At the initial stage, the mask 2 and the wafer 3 are chucked to the mask θ stage 4 and the wafer stage 24, respectively, while the pickup 12 projects light beam 423 to the alignment mark 421 of the mask for the AF (autofocusing) and AA (autoalignment) measurement.

First, at step 501, discrimination is made as to the necessity of mask replacement. If the exposure is to be effected by using the mask which is being chucked at this time, the sequence goes to step 504. If the mask is to be replaced by another, the sequence goes to step 502. At step 502, the current mask is demounted from the mask stage 4, by using a mask traverser (not shown) and the demounted mask is stored into a mask cassette (not shown). Then, a mask to be used for the exposure is taken out of its mask cassette by using the mask traverser and it is chucked to the mask stage 4. Then, at step 503, the pickup 12 is used to align the mark 420, provided on the mask 2 for mask alignment, with the reference mark 14 provided on the wafer stage.

The, at step 504, the wafer stage 24 is driven to place the position on the wafer, just to be exposed (i.e. the current shot position, namely, the transferred pattern 419), to be opposed to the mask pattern 418. Then, at step 505, the alignment marks 421 and 422 of the mask and the wafer are used to measure the gap between the mask and the wafer, and the corrective drive for tilt and z-axis position is effected. When the autofocusing is completed, at step 506 the alignment marks 421 and 422 of the mask and the wafer are used to measure deviation between the mask and the wafer with respect to the X and Y directions, and corrective drive is effected to attain autoalignment. Details of such autoalignment (step 506) will be described later.

When the autoalignment is completed, at step 507 the exposure of the current shot area is effected. Then, at step 508, a discrimination is made as to whether there remains an unexposed shot area. If it remains, the sequence goes back to step 504. If it does not remain, the sequence is finished.

Figure 6:
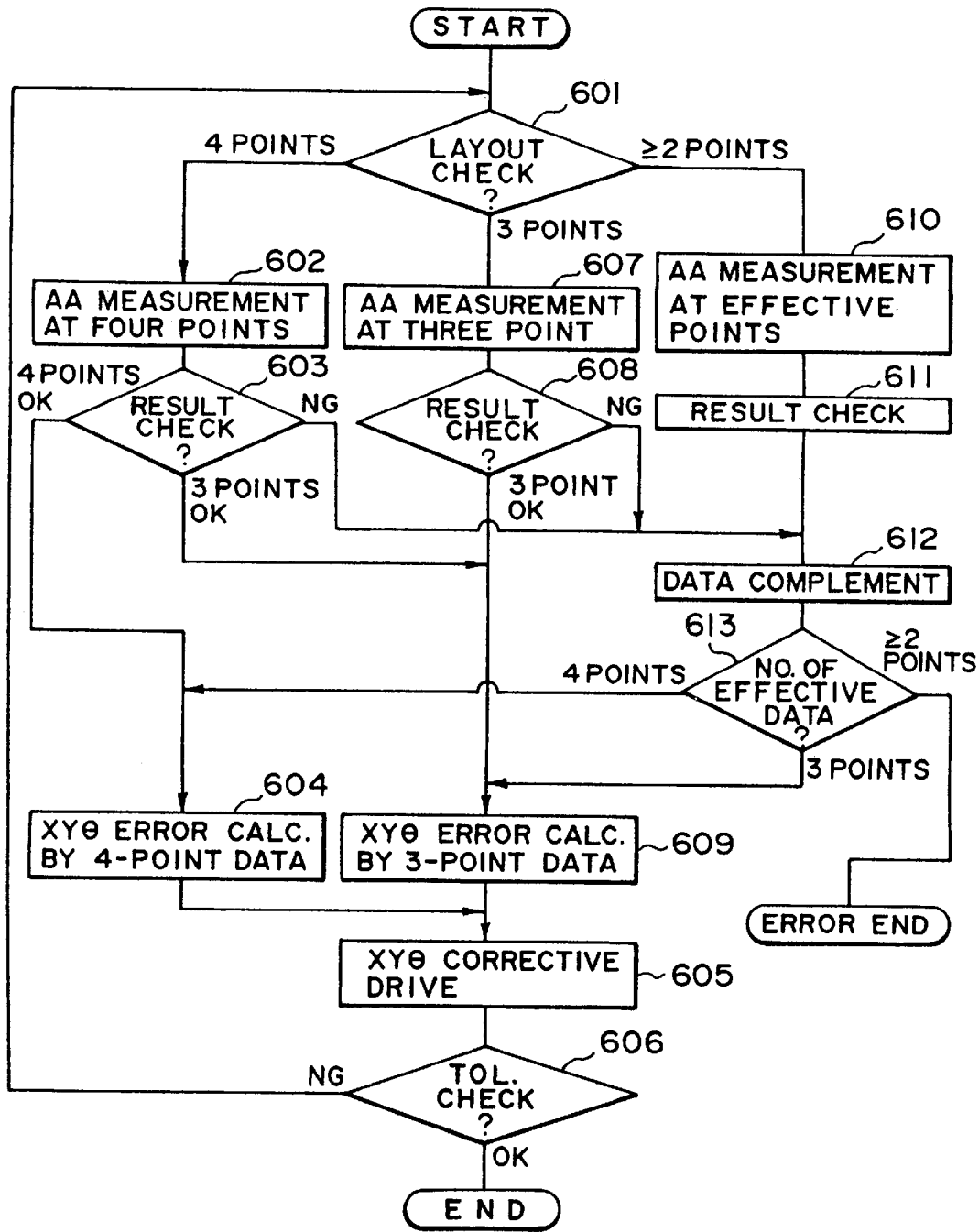
FIG. 6 is a flow chart, illustrating details of the autoalignment processing to be made at step 506 in FIG. 5.

FIG. 6 is a flow chart, illustrating details of the autoalignment processing at step 506 in FIG. 5. The illustrated pertains to autoalignment measurement and calculation of X, Y and θ deviations as well as corrective drive, all related to one shot area.

First, at step 601, the layout of the shot area (current shot area), just to be exposed, on the wafer is checked. FIG. 7 shows exemplary shot layout of one wafer. Characters S1–S3 denote shot areas. FIG. 8 illustrates exemplary disposition of alignment marks of one shot area. Characters a–d denote regular marks for measurement of mask-to-wafer deviation, and characters a'–d' denote spare marks, all of which are provided on both the mask and the wafer. Each mark is adapted to detect deviation of its position, with respect to one of the X and Y directions. The marks a, a', b and b' are adapted for detection in the X direction, while the marks c, c', d and d' are adapted for detection in the Y direction. Accordingly, for detection of X, Y and θ deviations of one shot area, it is necessary to measure at least those marks which are provided at three sides of the shot area.

When the shot area S1 is going to be exposed, since this shot area as a whole is defined on the wafer, all the marks a–d can be measured. Therefore, the sequence goes to step 602 and, by the projection of autoalignment light beams 423 from the pickups 12, four-point measurement is effected. At step 603, the results of measurement are checked. At this step, the failure of measurement due to any fault or breakage of any mark, or a measurement error resulting from excessive deviation between the mask 2 and the wafer 3 is checked.

FIG. 9 illustrates the characteristics of the output signal from the pickup 12 in relation to the deviation between the wafer and the mask in the X and Y direction. While details will be described later with reference to step 604, the extent of zones I and II corresponds to the AA measurement range, and the extent of zone III corresponds to the region of measurement error which is excluded by step 603. If the measurement has been attained with respect to all the four marks, the four-point measurement is successful (OK) and the sequence goes to step 604 at which calculation of X, Y and θ deviations is effected. Then, at step 605, a corrective drive is effected to correct the X, Y and θ errors. Then, at step 606, the amount of corrective drive is checked. If the quantity of correction, namely, the amount as obtained by calculation of deviation at step 604, is not greater than the tolerance, the AA processing is finished. If it is greater than the tolerance, sequence goes back to step 601. Details of the manner of calculating the X, Y and θ deviations will be explained later by reference to FIG. 10 and the like. If the measurement has been attained only with regard to three marks (step 603), three points are "OK" and the flow is combined into step 609 which is a part of the three-point measurement (steps 607–609) branched at step 601 from the sequence of the four-point measurement (steps 602–604) described above. Also, if the measurement has been attained only with regard to two marks or less, the measurement is "NG" and the flow goes to step 612 which is a part of the sequence of measurement using not greater than two points (steps 610–613), and a spare mark corresponding to the "NG" mark is measured.

When the shot area S2 shown in FIG. 7 is going to be exposed, the mark a shown in FIG. 8 is not present on the wafer and, thus, three-point measurement has to be effected. Thus, the flow goes from step 601 to step 607 at which the AA measurement is effected to three points, excluding the mark a. At step 608, the results of measurement are checked, like step 603. If the three points are "OK", the flow goes to step 609. If "NG", the flow goes to step 612. At step 609, calculation of the quantities of X, Y and θ corrections by using the three-point data is effected, including the case where the flow has been branched at step 603 from the four-point measurement sequence. It is now assumed that measurement of the mark a is not attainable and mask-to-wafer deviation data $\Delta XD$, $\Delta YL$ and $\Delta YR$ are obtained from the marks b, c and d. Then, deviations ΔX, ΔY and Δθ of the current shot area as a whole, can be determined by the following equations:

$$\Delta X = \Delta XD + \Delta\theta \cdot LX/2$$

$$\Delta Y = (\Delta YL + \Delta YR)/2$$

$$\Delta\theta = (\Delta YL - \Delta YR)/LY$$

By inverting the sign of each deviation, the corrective quantity (the amount of correction to be made) is obtained. Reference characters LX and LY each denote the distance between those marks with which the deviation in the corresponding direction is to be detected, and a value obtained at step 1006, to be described later, or a design value is used therefor. Also, where measurement of any mark other than the mark a is not attainable, it is possible to detect three unknown quantities ΔX, ΔY and Δθ from the data obtained by measurement to three points other than the measurement-unattained mark. Then, at step 605, a corrective drive is effected in the X, Y and θ directions.

Where the shot area S3 shown in FIG. 7 is going to be exposed, the measurement is attainable only with regard to the marks b and c in FIG. 8. While measurement of the mark d' is attainable, depending on the shape of each pickup and the disposition of the marks, there is a possibility of interference of the pickups. In consideration thereof, in the present embodiment, the measurement of the mark d' is effected later.

First, from step 601, the flow branches to step 610 and AA measurement is effected to two marks b and c. Then, at step 611, the results of measurement are checked and, at step 612, the insufficiency of the data is complemented. To this step 612, the flow having been branched from the four-point measurement or the three-point measurement is combined. Where the measurement has been attained only with regard to two points or less, like the shot area S3, since measurement is attainable with regard to the mark d', as described, the pickup 12d corresponding to the mark d is moved by the pickup stage 13d to the position above the spare mark d' and the mark d' measurement is effected. Where the flow has been branched from the four-point or three-point measurement in response to "NG", measurement of such a spare mark that corresponds to the "NG" mark is effected. Here, if the pickup 12 is moved, after completion of measurement it is necessary to move the pickup back to its preceding position for measurement of the next shot area. At step 613, the total number of effective data is checked. If it is four points, the flow goes to step 604 and, if it is three points, the flow goes to step 609, and calculation of X, Y and θ deviations is effected. If it is still not greater than two points, the flow goes to "error end" wherefrom a manual alignment operation is effected or, alternatively, the current shot area is skipped to the next shot area. As a further alternative, the alignment may be effected in accordance with prediction based on the information related to an adjacent shot area or areas and, thereafter, the exposure may be effected.

In the present embodiment, where the four-point measurement is effected at step 602 and, if three points are "OK" at step 603, deviation of the shot area is determined from the data of these three points. However, in such a case, the flow may go to step 612, rather than step 609, so that measurement of a spare mark corresponding to the "NG" mark may be effected. While the four-point measurement can reduce the effect of a measurement error as compared with the three-point measurement, the throughput decreases with the four-point measurement because data measurement of additional one point, with the movement of the pickup, is executed to such a shot area the alignment itself of which is attainable by the three-point measurement. Thus, whether either one should be selected will be determined in consideration of time and precision.

Figure 10:
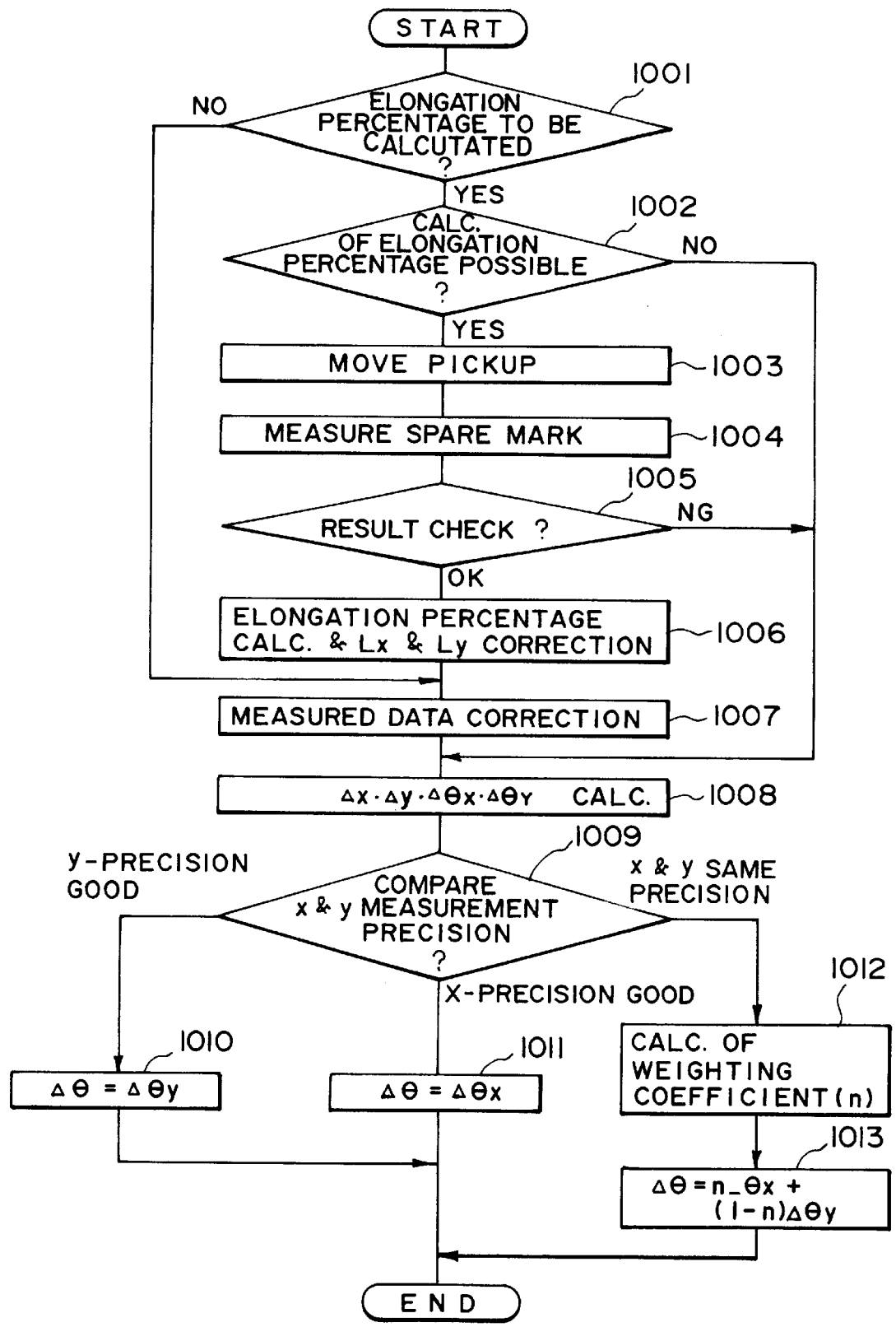
FIG. 10 is a flow chart, illustrating details of the processing to be made at step 604 in FIG. 6.

FIG. 10 is a flow chart, illustrating details of the processing made at step 604 of FIG. 6. The illustrated pertains to the sequence of calculation of X and Y and θ deviations of one shot area, from the data obtained by four-point measurement. First, at step 1001, a discrimination is made as to the necessity of calculation of an elongation percentage of this shot area. If the elongation or contraction of the wafer due to a process is substantially uniform in the whole wafer, such elongation percentage calculation is necessary only with regard to a first shot area. With regard to a second shot area and those shot areas following it, corrective calculation can be made on the basis of the elongation percentage as determined by calculation with regard to the first shot area. Thus, the sequence skips to step 1007.

When the elongation percentage calculation is necessary, whether it is possible or not is discriminated at step 1002. For calculation of the elongation percentage, it is necessary to measure at least one spare mark in respect to each of the X and Y directions. Therefore, if both of the two spare marks in the X or Y direction have been used to obtain four-point measurement data, the elongation percentage calculation is not attainable. If it is not attainable, the sequence goes to step 1008 but, if it is attainable, the sequence goes to step 1003.

At step 1003, the pickup 12 is moved to the position above a corresponding spare mark and, at step 1004, the mask-to-wafer deviation is measured by using the spare mark. At step 1005, the result of measurement is checked, like step 603 of FIG. 6. If at least one spare mark in each of the X and Y directions has been measured, the measurement is "OK" and the sequence goes to step 1006. If not, the elongation percentage calculation is not possible and the sequence goes to step 1008. At step 1006, the elongation percentage of the wafer is calculated, from the measured values related to the regular marks, as measured at steps 602, 607 and 610 of FIG. 6 as well as the measured values related to the spare marks, as measured at step 1004. Additionally, necessary correction of the mark intervals LX and LY is effected. Details of the manner of calculation will be explained by reference to FIG. 11.

Figure 11:
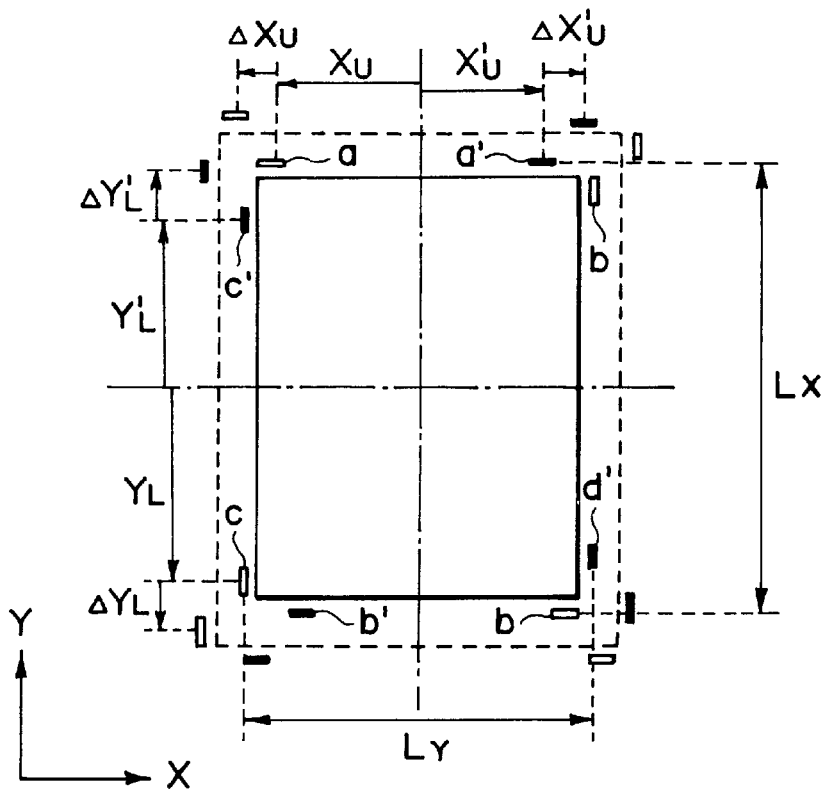
FIG. 11 is a schematic view, for explaining the calculation of elongation percentage of the wafer.

In FIG. 11, the solid line depicts the design size of one shot area, while the broken line depicts the size of that shot area having been expanded. The solid line can be considered as representing the shape of the shot area on the mask, while the broken line can be considered as representing the shape of the shot area on the wafer. The elongation percentage in the x-axis direction can be detected by using marks a and a', in the following manner: Where the design X coordinates of the marks a and a' as viewed from the center of the shot area are denoted by XU and XU', respectively, and where the measured values using the marks a and a' are denoted by ΔXU and ΔXU', then the elongation percentage ρxu in respect to the x direction can be given by:

$$\rho xu = (\Delta XU' - \Delta XU)/(XU' - XU)$$

Similarly, by using marks b and b', marks c and c' and marks d and d', respective elongation percentages can be detected as follows:

$$\rho XD = (\Delta XL - \Delta XL')/(XL - XL')$$

$$\rho YL = (\Delta YL' - \Delta YL)/(YL' - YL)$$

$$\rho YR = (\Delta YR - \Delta YR')/(YR - YR')$$

If, in each of the X and Y directions, the measurement has been attained only with regard to one spare mark, the detected elongation percentages can be used as $\rho X$ and $\rho Y$. If both of the two have been detected, an average of them may be calculated:

$$\rho X = (\rho XU + \rho XD)/2$$

$$\rho Y = (\rho YL + \rho YR)/2$$

Then, in accordance with the thus determined elongation percentages, correction of the mark intervals LX and LY is effected. Where the design values of the mark intervals are denoted by LX and LY such as shown in FIG. 11, the actual mark intervals to be used for calculation of the amount of $\theta$ rotation of the shot area have been changed due to expansion of the wafer. In consideration thereof, correction is necessary and it can be effected by the resetting, as follows:

$$LX \leftarrow LX(1+\rho X)$$

$$LY \leftarrow LY(1+\rho Y)$$

At step 1007, the measured data correction is effected on the basis of the elongation percentage as determined at step 1006. For such a shot area with respect to which the necessity of elongation percentage calculation has been denied at step 1001, the already calculated elongation percentage is used. While the measured data represents the mask-to-wafer deviation at the mark position, the amount of deviation in the sense of alignment of the center of the shot area corresponds to one obtained by subtracting the amount of elongation from the detected deviation. Thus:

$$XU \leftarrow \Delta XU - \rho X \cdot XU$$

$$XD \leftarrow \Delta XD - \rho X \cdot XD$$

$$YL \leftarrow \Delta YL - \rho Y \cdot YL$$

$$YR \leftarrow \Delta YR - \rho Y \cdot YR$$

Figures 12A, 12B:
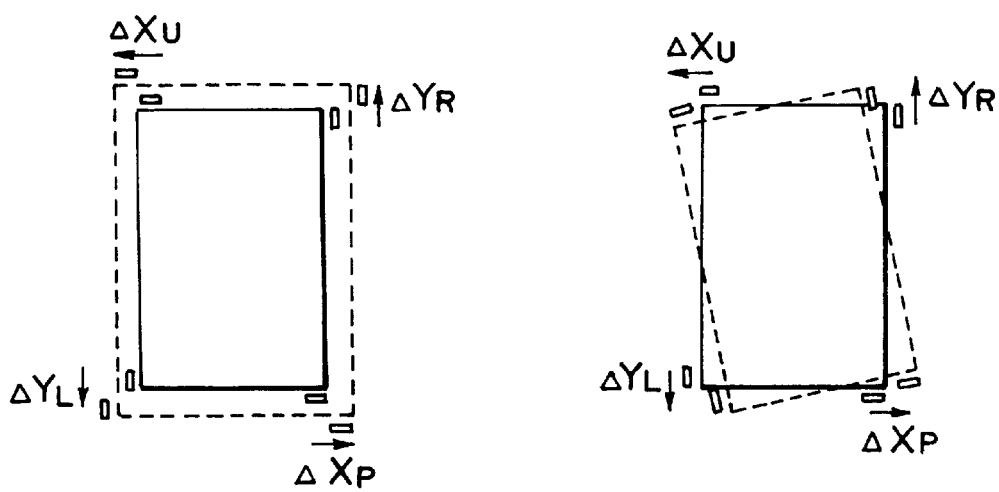
FIGS. 12A and 12B are schematic views, respectively, for explaining the deviation due to wafer elongation and the deviation due to rotation, respectively.

By these corrections, it is possible to avoid deviation due to expansion of the wafer, as illustrated in FIG. 12A. Also, it is possible to discriminate deviation due to rotation, as illustrated in FIG. 12B.

Subsequently, at step 1008, deviations $\Delta X$, $\Delta Y$, $\Delta \theta X$ and $\Delta \theta Y$ of the shot area are calculated. Here, as for the mark intervals and the measured data, if the elongation percentage calculation has been made, those values obtained by correction are used. The calculation may be made in accordance with the following equation:

$$\Delta X = (\Delta XU + \Delta XD)/2$$

$$\Delta Y = (\Delta YL + \Delta YR)/2$$

$$\Delta \theta X = (\Delta XU - \Delta XD)/LX$$

$$\Delta \theta Y = (\Delta YL - \Delta YR)/LY$$

wherein $\Delta \theta X$ and $\Delta \theta Y$ are the amounts of $\theta$ rotational deviation as determined from the measured data with respect to the X and Y directions.

While in the present embodiment such a mark is used with which a positional deviation only in respect to one direction can be measured, if a mark that allows measurement in regard to both the X and Y directions is used, similar correction is attainable without using a spare mark.

At step 1009, the precision of measurement in the X direction is compared with that in the Y direction. Inherently, the deviations $\Delta \theta X$ and $\Delta \theta Y$ as detected at step 1008 have the same value. Actually, however, usually they have different values, because of the measurement precision or distortion of the wafer or the like. In consideration thereof, one having better precision is adopted for the corrective drive.

Currently, an attempt to increase the resolution of a measuring optical system so as to ensure precise alignment, will result in a narrowed range of measurement within which the signal output of the measuring system has a rectilinear relation with the amount of deviation between the mask and the wafer. In consideration thereof, in the present embodiment, to such an optical system as having those characteristics shown in FIG. 9, not only the rectilinear region (zone I) but also the non-rectilinear regions (zone II) which are at the opposite sides of the zone I, are defined and used as the measurement range. As a matter of course, the measurement precision is lower in the zone II than in the zone I, and the chasing such as executing corrective drive and then effecting the measurement once again within the zone I, will be necessary.

In the case occasion where the mask and the wafer are deviated such as illustrated in FIG. 13, there is a large drift in the X direction and, also, the deviation contains a $\theta$ rotational component. As a result, it is possible that deviations $\Delta XD$, $\Delta YL$ and $\Delta YR$ are in the zone I, whereas deviation $\Delta XU$ is in the zone II. In such case, the reliability is higher in the deviation $\Delta \theta Y$ than in the deviation $\Delta \theta X$ detected at step 1008 of FIG. 10 and, therefore, use of the deviation $\Delta \theta Y$ as the $\theta$ rotational deviation $\Delta \theta$ is effective to attain a reduced number of chasing operations. Accordingly, when both of the measured values in the Y direction are within the zone I while at least one of the measured values in the X direction is within the zone II, at step 1010 the detected deviation $\Delta \theta Y$ is taken as the $\theta$ rotational deviation $\Delta \theta$. If, on the other hand, both of the two measured values in the X direction are within the zone I, while at least one of the measured values in the Y direction is within the zone II, at step 1011 the detected deviation $\Delta \theta X$ is taken as the $\theta$ rotational deviation $\Delta \theta$. If they are in the same zone, in both of the X and Y directions, the sequence goes to step 1012.

At step 1012, calculation is effected to determine the weighting coefficient n ($0 \leq m \leq 1$), for determining the $\theta$ rotational deviation $\Delta \theta$ by temporal coupling of $\Delta \theta X$ and $\Delta \theta Y$, in the case where the measurement precision is the same in the X direction and in the Y direction. As regards $\Delta \theta X$ and $\Delta \theta Y$, it is clear from the equation that, if the mark measurement precision is the same, one having a larger denominator has higher precision. Thus, the weighting coefficient n is expressed by:

$$n = LX/(LX+LY)$$

and the $\theta$ rotational deviation $\Delta \theta$ is expressed by:

$$\Delta \theta = n \cdot \Delta \theta X + (1-n) \Delta \theta Y$$

as set forth in the block of step 1013. By this, the weighting according to the precision, is attainable.

Here, LX and LY used in the calculation of the weighting coefficient n are those values having been corrected at step 1006 in consideration of the elongation percentage. If, however, the elongation percentage calculation is not attainable at step 1002 or 1005 and LX and LY are held at their design values, the weighting coefficient n can be calculated in the following manner. This method can be used in a case where the tendency of elongation/contraction of the wafer in each of the X and Y directions is predetected, from the direction of crystal growth of the wafer, for example. If the indeterminancy ratio ("indeterminate length"/"base length") of the length of the wafer in the X direction is denoted by $\alpha X$ and if that in the Y direction is denoted by $\alpha Y$, then, by the following corrections:

$$LX \leftarrow LX \cdot (1-\alpha X)$$

$$LY \leftarrow LY \cdot (1-\alpha Y)$$

it is possible to determine the weighting coefficient n in accordance with a similar equation used in the preceding example. Of course, the weighting coefficient n may be determined in accordance with various other conditions.

In the FIG. 10 example, the deviations $\Delta X$, $\Delta Y$ and $\Delta \theta$ are determined after correcting the measured values on the basis of the elongation percentage. However, where at least one of the measured values is within the zone II and if deterioration of precision due to the non-rectilinearity is greater than that due to the elongation, the branching based on discrimination at step 1009 may precede step 1008 to omit elongation correction to step 1010 or 1011.

While the foregoing description has been provided of to the sequence of autoalignment, the concept of selection of a suitable sequence in accordance with the shot layout information or occurrence of a measurement error as well as the concept of complementing the measured data by using a spare mark, can be applied to the sequence of autofocusing.

While the invention has been described with reference to the structures disclosed herein, it is not confined to the details set forth and this application is intended to cover such modifications or changes as may come within the purposes of the improvements or the scope of the following claims.

What is claimed is:

1. An alignment method usable with an original having a pattern and a substrate having a surface area on which the pattern of the original is to be printed, said alignment method comprising the steps of:

detecting, by mark detecting means, plural marks provided in relation to the surface area of the substrate, prior to the printing of the pattern of the original on the surface area of the substrate;

calculating, plural times, the amount of rotational deviation between the original and the substrate with respect to the surface area of the substrate, on the basis of different combinations of pieces of the mark detection information as outputted from the mark detecting means;

weighting the obtained rotational deviation amounts on the basis of respective precisions of different pieces of the mark detection information, and calculating the quantity of rotational correction to the original and the substrate by using the weighted rotational deviation amounts; and aligning the original and the substrate on the basis of the calculated quantity of rotational correction.

2. A method according to claim 1, wherein the mark detecting means has a first zone in which a value represented by the mark detection information changes rectilinearly with a change in positional deviation of a mark, and a second zone in which the value represented by the mark detection information changes non-rectilinearly with the change in positional deviation of the mark, and wherein said method further comprises the step of discriminating the precision of the mark detection information on the basis of whether the value represented by the mark detection information is either in the first zone or in the second zone.

3. A method according to claim 2, wherein said weighing step comprises the step of providing a value for the weighting to be one of the mark detection information having the highest precision, and zero for the remaining mark detection information.

4. A method according to claim 1, further comprising the step of presetting the precision of the mark detection information with regard to each of the plural marks.

5. An alignment method, usable with an original having a pattern and a substrate having a surface area on which the pattern of the original is to be printed, said alignment method comprising the steps of:

detecting, by mark detecting means, plural marks provided in relation to the surface area of the substrate, prior to the printing of the pattern of the original on the surface area of the substrate;

calculating, plural times, the amount of rotational deviation between the original and the substrate with respect to the surface area of the substrate, on the basis of different combinations of pieces of mark detection information as outputted from the mark detecting means;

weighting the calculated rotational deviation amounts on the basis of a mark interval, in each of the combinations, and calculating the quantity of rotational correction to the original and the substrate by using the weighted rotational deviation amounts; and aligning the original and the substrate on the basis of the calculated quantity of rotational correction.

6. A semiconductor device manufacturing method comprising the steps of:

preparing a mask having a pattern and a wafer having a surface area on which the pattern of the mask is to be printed;

detecting, by mark detecting means, plural marks provided in relation to the surface area of the wafer;

calculating, plural times, the amount of rotational deviation between the mask and the wafer with respect to the surface area of the wafer, on the basis of different combinations of pieces of the mark detection information as outputted from the mark detecting means;

weighting the obtained rotational deviation amounts on the basis of respective precisions of different pieces of the mark detection information, and calculating the quantity of rotational correction to the mask and the wafer by using the weighted rotational deviation amounts;

aligning the mask and the wafer on the basis of the calculated quantity of rotational correction; and printing the pattern of the mask on the surface area of the wafer.

7. A semiconductor device manufactured by a method comprising the steps of:

preparing a mask having a pattern and a wafer having a surface area on which the pattern of the mask is to be printed;

detecting, by mark detecting means, plural marks provided in relation to the surface area of the wafer;

calculating, plural times, the amount of rotational deviation between the mask and the wafer with respect to the surface area of the wafer, on the basis of different combinations of pieces of the mark detection information as outputted from the mark detecting means;

weighting the obtained rotational deviation amounts on the basis of respective precisions of different pieces of the mark detection information, and calculating the quantity of rotational correction to the mask and the wafer by using the weighted rotational deviation amounts;

aligning the mask and the wafer on the basis of the calculated quantity of rotational correction; and printing the pattern of the mask on the surface area of the wafer.

8. A semiconductor device manufacturing method comprising the steps of:

preparing a mask having a pattern and a wafer having a surface area on which the pattern of the mask is to be printed;

detecting, by mark detecting means, plural marks provided in relation to the surface area of the wafer;

calculating, plural times, the amount of rotational deviation between the mask and the wafer with respect to the surface area of the wafer, on the basis of different combinations of pieces of mark detection information as outputted from the mark detecting means;

weighting the calculated rotational deviation amounts on the basis of a mark interval, in each of the combinations, and calculating the quantity of rotational correction to the mask and the wafer by using the weighted rotational deviation amounts;

aligning the mask and the wafer on the basis of the calculated quantity of rotational correction; and printing the pattern of the mask on the surface area of the wafer.

9. A semiconductor device manufactured by a method comprising the steps of:

preparing a mask having a pattern and a wafer having a surface area on which the pattern of the mask is to be printed;

detecting, by mark detecting means, plural marks provided in relation to the surface area of the wafer;

calculating, plural times, the amount of rotational deviation between the mask and the wafer with respect to the surface area of the wafer, on the basis of different combinations of pieces of mark detection information as outputted from the mark detecting means;

weighting the calculated rotational deviation amounts on the basis of a mark interval, in each of the combinations, and calculating the quantity of rotational correction to the mask and the wafer by using the weighted rotational deviation amounts;

aligning the mask and the wafer on the basis of the calculated quantity of rotational correction; and printing the pattern of the mask on the surface area of the wafer.

* * * * *

UNITED STATES PATENT AND TRADEMARK OFFICE
CERTIFICATE OF CORRECTION

PATENT NO. : 6,018,395

DATED : January 25, 2000

INVENTOR(S): MAKIKO MORI, ET AL.

It is certified that error appears in the above-identified patent and that said Letters Patent is hereby corrected as shown below:

IN THE DRAWINGS:
SHEET NO. 6:
Figure 6, In step 607, "THREE POINT" should read --THREE POINTS--, and following step 608, "3 POINT" should read --3 POINTS--.

SHEET NO. 9:
Figure 10, "CALCUTATED" should read --CALCULATED--.

IN THE DISCLOSURE:
COLUMN 1:
Line 25, "order" should be deleted;
Line 27, "menthods" should read --methods--;
Line 29, "the" ($2^{nd}$ occurrence) should read --a--;
Line 56, ";" should be deleted; and
Line 57, "and" should be deleted.

COLUMN 3:
Line 13, "of" should read --of the--.

UNITED STATES PATENT AND TRADEMARK OFFICE
CERTIFICATE OF CORRECTION

PATENT NO. : 6,018,395

DATED : January 25, 2000

INVENTOR(S): MAKIKO MORI, ET AL.

It is certified that error appears in the above-identified patent and that said Letters Patent is hereby corrected as shown below:

COLUMN 5:
Line 35, "corresponding" should read --corresponding to--; and
Line 47, "which" should read --in which--.

COLUMN 6:
Line 11, "a" (1st occurrence) should read --an--;
Line 40, "mask 9" should read --mask θ--; and
Line 49, "for." should read --for--.

COLUMN 7:
Line 41, "The," should read --Then,--.

COLUMN 8:
Line 57, "at which" should read --at which point--.

COLUMN 10:
Line 33, "measurement" should read --the measurement--; and
Line 57, "in" should read --with--.

UNITED STATES PATENT AND TRADEMARK OFFICE
CERTIFICATE OF CORRECTION

PATENT NO. : 6,018,395

DATED : January 25, 2000

INVENTOR(S): MAKIKO MORI, ET AL.

It is certified that error appears in the above-identified patent and that said Letters Patent is hereby corrected as shown below:

COLUMN 12:
Line 22, "occasion" should be deleted.

COLUMN 13:
Line 22, "to" should be deleted.

Signed and Sealed this

Tenth Day of April, 2001

Attest:

NICHOLAS P. GODICI

Attesting Officer

Acting Director of the United States Patent and Trademark Office